United States Patent
Leung et al.

(10) Patent No.: US 8,188,798 B1
(45) Date of Patent: May 29, 2012

(54) PROGRAMMABLE ELECTRO-MAGNETIC-INTERFERENCE (EMI) REDUCTION WITH ENHANCED NOISE IMMUNITY AND PROCESS TOLERANCE

(75) Inventors: Chi Tak (Gerry) Leung, Hong Kong (HK); Chik Wai (David) Ng, Hong Kong (HK); Hing Kit Kwan, Hong Kong (HK); Wai Kit (Victor) So, Hong Kong (HK); Po Wah (Patrick) Chang, Kowloon (HK); Wing Cheong Mak, Hong Kong (HK); Kwok Kuen (David) Kwong, Davis, CA (US)

(73) Assignee: Hong Kong Applied Science and Technology Research Institute Company, Ltd., Hong Kong (HK)

( * ) Notice: Subject to any disclaimer, the term of this patent is extended or adjusted under 35 U.S.C. 154(b) by 56 days.

(21) Appl. No.: 12/948,896

(22) Filed: Nov. 18, 2010

(51) Int. Cl.
*H03B 29/00* (2006.01)
*H03K 3/26* (2006.01)

(52) U.S. Cl. .......................................... 331/78; 331/111
(58) Field of Classification Search .................. 331/111, 331/143, 178, 78
See application file for complete search history.

(56) References Cited

U.S. PATENT DOCUMENTS

| | | | |
|---|---|---|---|
| 5,757,338 A | 5/1998 | Bassetti et al. | |
| 6,249,876 B1 | 6/2001 | Balakrishnan et al. | |
| 7,289,582 B2 | 10/2007 | Jang et al. | |
| 7,358,821 B2 * | 4/2008 | Chia | 331/78 |
| 7,423,494 B1 | 9/2008 | Xin-LeBlanc | |
| 7,489,529 B2 | 2/2009 | Yang | |
| 7,504,897 B2 * | 3/2009 | Chava et al. | 331/78 |

* cited by examiner

*Primary Examiner* — Ryan Johnson
(74) *Attorney, Agent, or Firm* — Stuart T. Auvinen; gPatent LLC

(57) ABSTRACT

A frequency dithering circuit reduces emissions that cause Electro-Magnetic Interference (EMI) by spreading the spectrum of a clock. The clock sequences a counter that drives a digital count value to a digital-to-analog converter (DAC). The DAC outputs a sawtooth wave with a wide voltage swing. A subtractor scales down the voltage swing to produce a reduced-swing sawtooth wave which is used as an upper limit voltage. Comparators trigger a set-reset latch to toggle the clock when current pumps charge and discharge a capacitor beyond voltage limits. Since the upper limit voltage is the reduced sawtooth wave from the subtractor, the amount of time to charge the capacitor varies, dithering the period of the clock. The degree of dithering can be adjusted by programming the feedback resistance in the subtractor. The subtractor reduces the sensitivity of dithering to errors in the DAC, allowing for an inexpensive, less precise DAC.

20 Claims, 10 Drawing Sheets

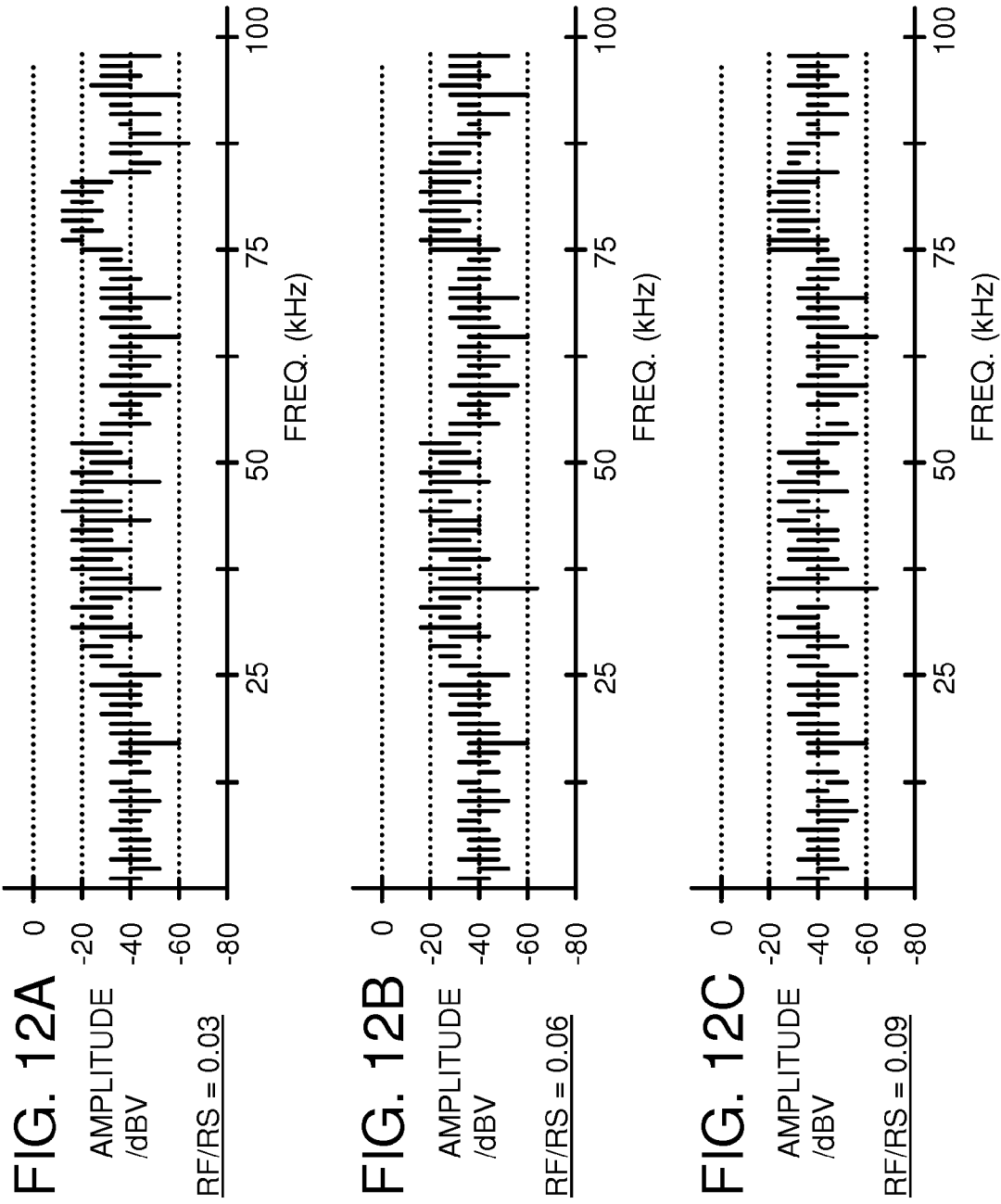

PROGRAMMABLE ELECTRO-MAGNETIC-INTERFERENCE (EMI) REDUCTION WITH ENHANCED NOISE IMMUNITY AND PROCESS TOLERANCE

FIELD OF THE INVENTION

This invention relates to Electro-Magnetic Interference (EMI) reduction, and more particularly to circuits with frequency dithering for reduced EMI.

BACKGROUND OF THE INVENTION

Power converters may include a large transistor that is rapidly switched on and off. This rapid switching can cause noise on the resulting power-supply voltage, and upon other nearly signals. Downstream and upstream devices from the power converter can generate emissions that create disturbances in other electronic equipment. For example, a noisy switching power supply driving a portable computer may emit radiation that interferes with a television receiver. Intentional receivers, such as televisions, cellular phones, pagers, and wireless devices, are often affected by unintentional transmitters that emit electromagnetic radiation. As both types of electronic equipment become more common, interference becomes more noticeable to the consumer.

Electromagnetic interference (EMI) is a measure of the amount of interference that an electronic device (the unintentional transmitter) disturbs an intentional receiver. Government agencies such as the Federal Communication Commission (FCC) strictly regulate the amount of radiation or EMI that an electronic device can generate.

Improving technology also worsens the EMI problem. Faster clock rates of higher-speed equipment generate more radiation. Higher resolution monitors and displays require that more pixels be transferred to the screen for each screen refresh period; thus a higher clock rate and more interference results.

Traditional techniques to reduce EMI attempt to contain radiation or to reduce the amount of radiation generated. Coax wires and shielded cables are effective at containing radiation, but are expensive, heavy, bulky, and inflexible. The weight and bulk of shielded cables make them undesirable for portable devices. Metal chassis with sealed seams are effective for reducing EMI of desktop equipment, but portable devices are kept light by using plastic.

Lower voltages reduce the intensity of the radiation generated, and the new 3-volt standard has helped reduce EMI at all harmonics. Proper impedance matching and termination of signals reduces ringing and harmonics, and shorter signal traces further reduce radiation. Ground planes on PCB's or ground lines running parallel with signal lines effectively shield signals on boards. Filtering can reduce sharp rise and fall times and reduce radiation by wave shaping since more sinusoidal waves have fewer harmonics than square waves. Of course, filters require additional capacitors, resistors, or inductors, raising the cost. All of these techniques are useful to varying extents.

Large physical components are often needed as filters to reduce noise and EMI. For example, a large inductor coil may be added to a power converter, along with high-value capacitors that also are bulky. Precision capacitors or resistors may be needed. These bulky components are undesirable and costly and defeat integration.

A newer technique to reduce EMI is to vary or modulate the frequency of clocks. This technique known as spread spectrum, since the frequency spectrum of the clock is spread out over a wider range of frequencies. FIG. 1 shows a graph of radiation intensity as a function of frequency for an un-modulated clock signal. A sharp spike occurs at a harmonic of the clock's frequency, 40 MHz. Since the clock constantly operates at the rated frequency, all of the energy of the radiation appears in a narrow spike, which has a large amplitude. The spike has an amplitude over the EMI limit set by the FCC. The high intensity of the spike can cause interference in a receiver.

FIG. 2 is a graph of radiation intensity as a function of frequency generated by a modulated clock. The clock's frequency is not constant, but is varied with time over a range of +5% to −5% of the rated frequency. Thus the clock operates at 40 MHz for a period of time, but also operates at other frequencies between 38 MHz and at 42 MHz at other times. Such a clock can be generated by slowly changing the frequency from 38 MHz to 42 MHz and then slowly reducing the frequency back to 38 MHz. A voltage-controlled oscillator (VCO) can be used with the input voltage being slewed back and forth between voltages that generate 38 MHz and 42 MHz oscillations.

Since the modulated clock spends only part of the time at 40 MHz, the intensity of the radiation, averaged over a relatively long time, is reduced. The total energy of the radiation at all frequencies is about the same as for the un-modulated clock of FIG. 1, but the intensity at any particular frequency is greatly reduced. Interference at any one frequency is reduced since receivers generally are tuned to a particular frequency (even FM receivers are tuned to a relatively small range of frequencies).

Thus modulating the clock's frequency reduces the maximum intensity of radiation at any one frequency, although the energy radiated at all frequencies is not reduced. This has the practical effect of reducing interference for receivers tuned to a fixed frequency.

Long Sweep Period of Modulation—FIG. 3

FIG. 3 is a graph of a modulated clock's frequency as a function of time over a few sweep periods. The clock's nominal frequency is 40 MHz. The clock is modulated by +/−5%, from 38 MHz to 42 MHz. The clock's frequency is swept from minimum to maximum frequencies over one or two thousand clock periods so that adjacent clock pulses have a very small variation. A 40 MHz clock with a 25 nanosecond (ns) period is varied from 26.25 ns to 23.75 ns over a sweep period, a variation of +/−1.25 ns. A 37 KHz sweep rate has a sweep period of 27 micro-seconds (μs). A sweep period is 27 μs/25 ns or 1081 clock periods. The cycle-to-cycle period variation for two adjacent clock periods is thus 5 ns/1081 or 4.62 pico-seconds (ps). The sweep frequency is typically 15 to 50 KHz.

Such spread spectrum using frequency dithering is effective in reducing EMI. Bulky filter components such as large capacitors and inductors are not needed. However, often such frequency dithering requires switching precise components such as precision capacitors to generate small steps or adjustments in frequency. Matching of these precision capacitors or resistors is difficult. Very large capacitors or very small currents or resistors must be used. Such small currents are themselves subject to noise interference and leakages and are thus undesirable.

What is desired is a frequency dithering circuit for reducing EMI for a switched power supply. A dithering circuit that does not need bulky filters or precision components is desirable. A dithering circuit that can be integrated with other circuits for a small form factor is desirable. A dithering circuit that can be tuned or programmed for the degree of frequency dithering is desirable. A dithering circuit that can be used with an oscillator for a switched power supply is desirable. A dithering circuit that can be used as a module for a clock generator is also desired.

BRIEF DESCRIPTION OF THE DRAWINGS

FIGS. 12A-C are waveforms showing the effects on emissions of different programmable values of feedback resistance.

DETAILED DESCRIPTION

The present invention relates to an improvement in EMI reduction circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that a digital-to-analog converter (DAC) can be used to adjust the frequency of an oscillator or other clock generator. This frequency dithering can reduce or eliminate bulky filter components and allow for integration and small form factor devices.

The inventors further realize that matching of precision resistors and capacitors for the DAC can be relaxed if the resolution requirement of the DAC is relaxed. The DAC resolution can be reduced by scaling and subtraction of the DAC output. The inventors further realize that programming the subtractor after the DAC can allow for the degree of dithering to be programmed.

Figure 1:
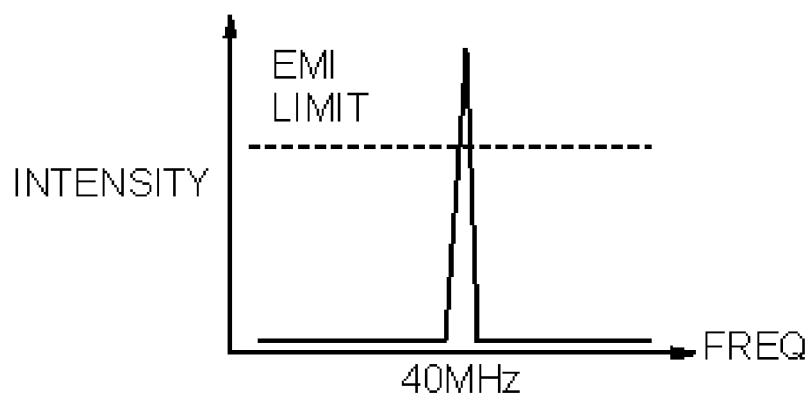
FIG. 1 shows a graph of radiation intensity as a function of frequency for an un-modulated clock signal.
Figure 2:
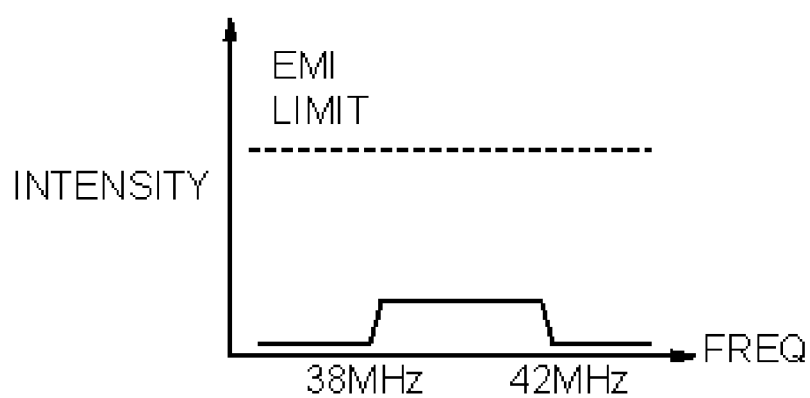
FIG. 2 is a graph of radiation intensity as a function of frequency generated by a modulated clock.
Figure 3:
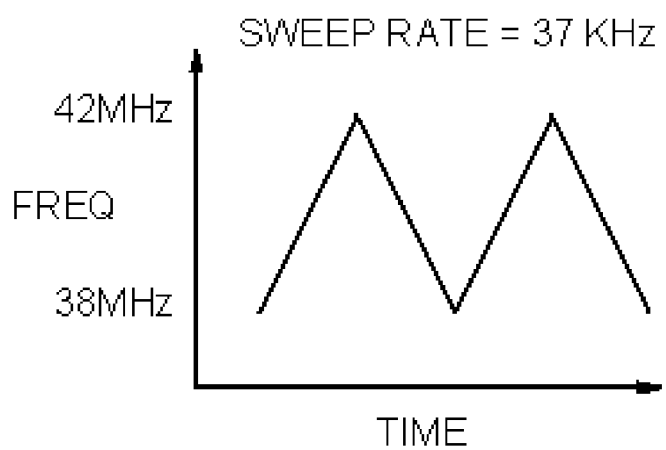
FIG. 3 is a graph of a modulated clock's frequency as a function of time over a few sweep periods.
Figure 4:
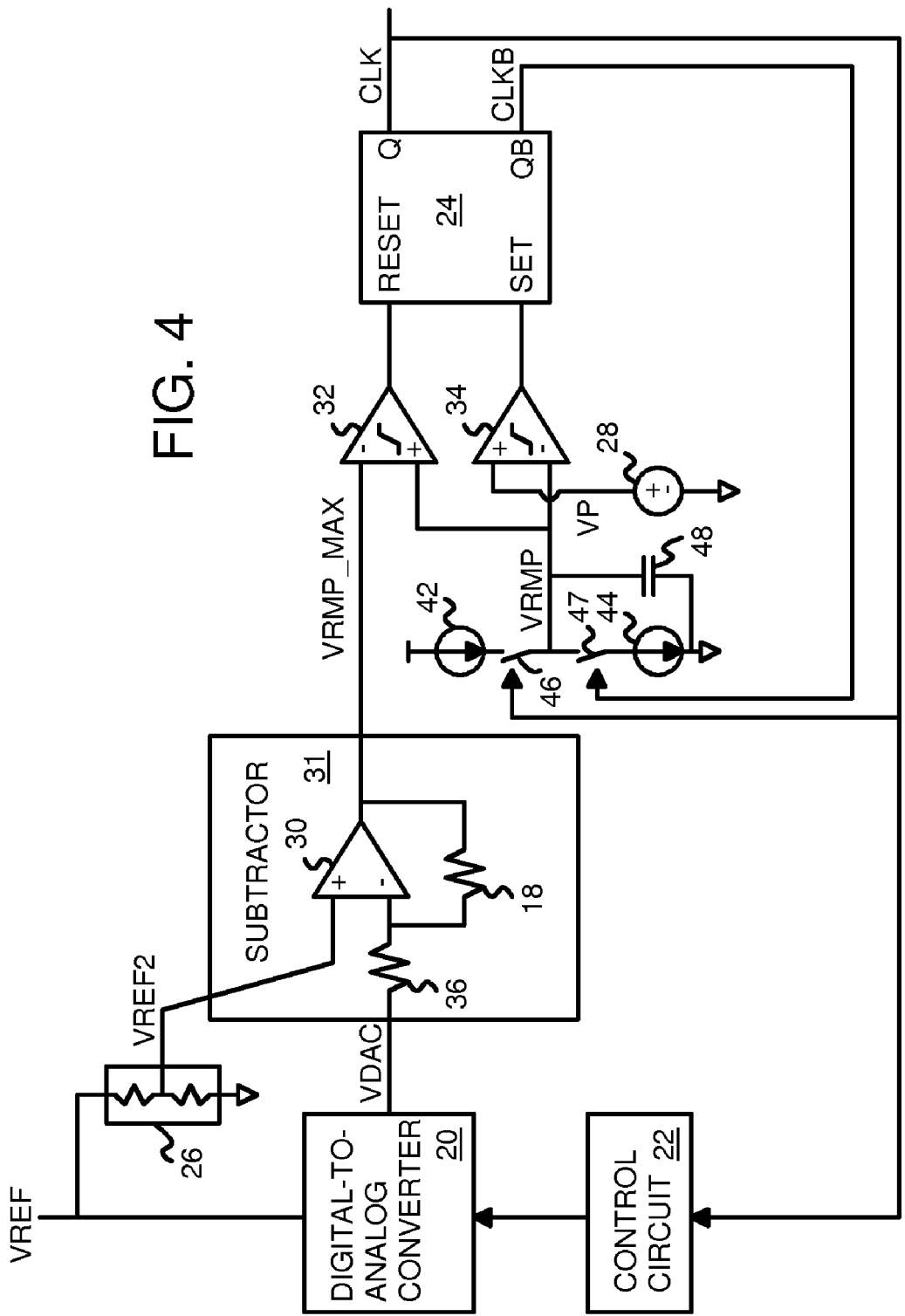
FIG. 4 is a schematic of a frequency dithering circuit for modulating oscillating of a clock.

FIG. 4 is a schematic of a frequency dithering circuit for modulating oscillating of a clock. Clock CLK may be used to switch a large field-effect transistor (FET) in a switching power supply, or may be used for some other purpose. SR latch 24 toggles to cause its outputs CLK and CLKB to pulse. The CLK signal is fed back to control circuit 22. In some embodiments, control circuit 22 is a counter, such as a binary counter. The count value from control circuit 22 is input to digital-to-analog converter (DAC) 20, and DAC 20 converts the digital count value to an analog voltage VDAC that is a fraction of analog input voltage Vref, with the fraction depending on the digital input value from control circuit 22.

Voltage divider 26 generates a lower voltage Vref2 from Vref, and this lower reference voltage Vref2 is input to subtractor 31. The other input to subtractor 31 is the converted analog voltage VDAC from DAC 20.

Subtractor 31 includes op amp 30, which receives Vref2 on its non-inverting (+) input. Input resistor 36 is in series between VDAC from DAC 20 and the inverting (−) input to op amp 30. Feedback resistor 18 is connected between the output and inverting input of op amp 30. The ratio of resistances of input resistor 36 and feedback resistor 18 determines the amount of scaling of VDAC, which also determines the degree of frequency dithering.

Subtractor 31 scales down the analog output from DAC 20. The output of subtractor 31 is ramp voltage Vrmp_max, which is a scaled-down reproduction of the VDAC voltage from DAC 20. Scaling down the DAC output also reduces the effect of errors from DAC 20 on the frequency of clock CLK. Thus the dithering circuit is less sensitive to errors from DAC 20 due to subtractor 31. A larger step size or difference between voltage levels of DAC 20 can be tolerated. Thus resistors, capacitors, or other components inside DAC 20 do not have to be matched as precisely.

The binary count value from control circuit 22 counts up and then counts down. The resulting converted analog voltage VDAC from DAC 20 is a sawtooth wave that slowly rises and then slowly falls. Subtractor 31 reduces the amplitude of the sawtooth wave from DAC 20, so that ramp voltage Vrmp_max is also a sawtooth wave, but with a smaller voltage swing.

When CLK is high and CLKB low, switch 46 is closed, and switch 47 is open. Switch 46 allows current source 42 to drive current from the power supply to node Vrmp, charging capacitor 48. Voltage Vrmp rises. Once Vrmp rises above ramp voltage Vrmp_max, comparator 32 is triggered, since its + input is Vrmp and its − input is Vrmp_max. Comparator 32 triggers a pulse to the reset input of SR latch 24 causing CLK to go low and CLKB to go high.

When CLK is low and CLKB is high, switch 46 is open, and switch 47 is closed. Switch 47 allows current sink 44 to sink current to ground from node Vrmp, discharging capacitor 48. Voltage Vrmp falls. Limit voltage VP is generated by voltage source 28. Once Vrmp falls below limit voltage VP, comparator 34 is triggered, since its + input is VP and its − input is Vrmp. Comparator 34 triggers a pulse to the set input of SR latch 24 causing CLK to go high and CLKB to go low.

Ramp voltage Vrmp_max acts as a maximum voltage limit, while limit voltage VP acts as a minimum voltage limit. While the minimum voltage limit is fixed, the maximum voltage limit varies with the sawtooth wave from DAC 20.

As Vrmp slowly rises as the count value input to DAC 20 increases, the upper limit rises. Since current source 42 delivers a fixed current, it takes a longer period of time to charge capacitor 48 up to the new higher limit of Vrmp. This longer time required to charge capacitor 48 to the higher Vrmp_max delays the next falling transition of CLK, thus increasing the clock period and decreasing the frequency. Likewise, the increased charge on capacitor 48 at the higher Vrmp that matches Vrmp_max takes a longer time to discharge, so the rising transitions of CLK are also delayed. Thus both clock edges are delayed as Vrmp_max rises, and frequency drops.

Once control circuit 22 has reached the maximum count value, it reverses direction and counts down. The decreasing digital values applied to DAC 20 produce a series of decreasing steps down in voltage VDAC. These large steps in VDAC are scaled down by subtractor 31 to smaller steps downward in voltage Vrmp_max. As Vrmp_max drops, charging and discharging require less time, and the clock frequency increases.

The peak value of Vrmp_max, Vrmp_peak, is related to Vref2, VDAC, the series resistance Rs of input resistor 36 and the feedback resistance Rf of feedback resistor 18 as follows:

$$Vrmp\_peak = Vref2 - (Rf/Rs) * VDAC.$$

Thus adjusting the ratio of resistors 18, 36 adjusts the peak limit voltage, the maximum charging time, and thus the period of the clock. Thus Rf/Rs adjusts a degree or maximum amount of frequency dithering.

Figure 5:
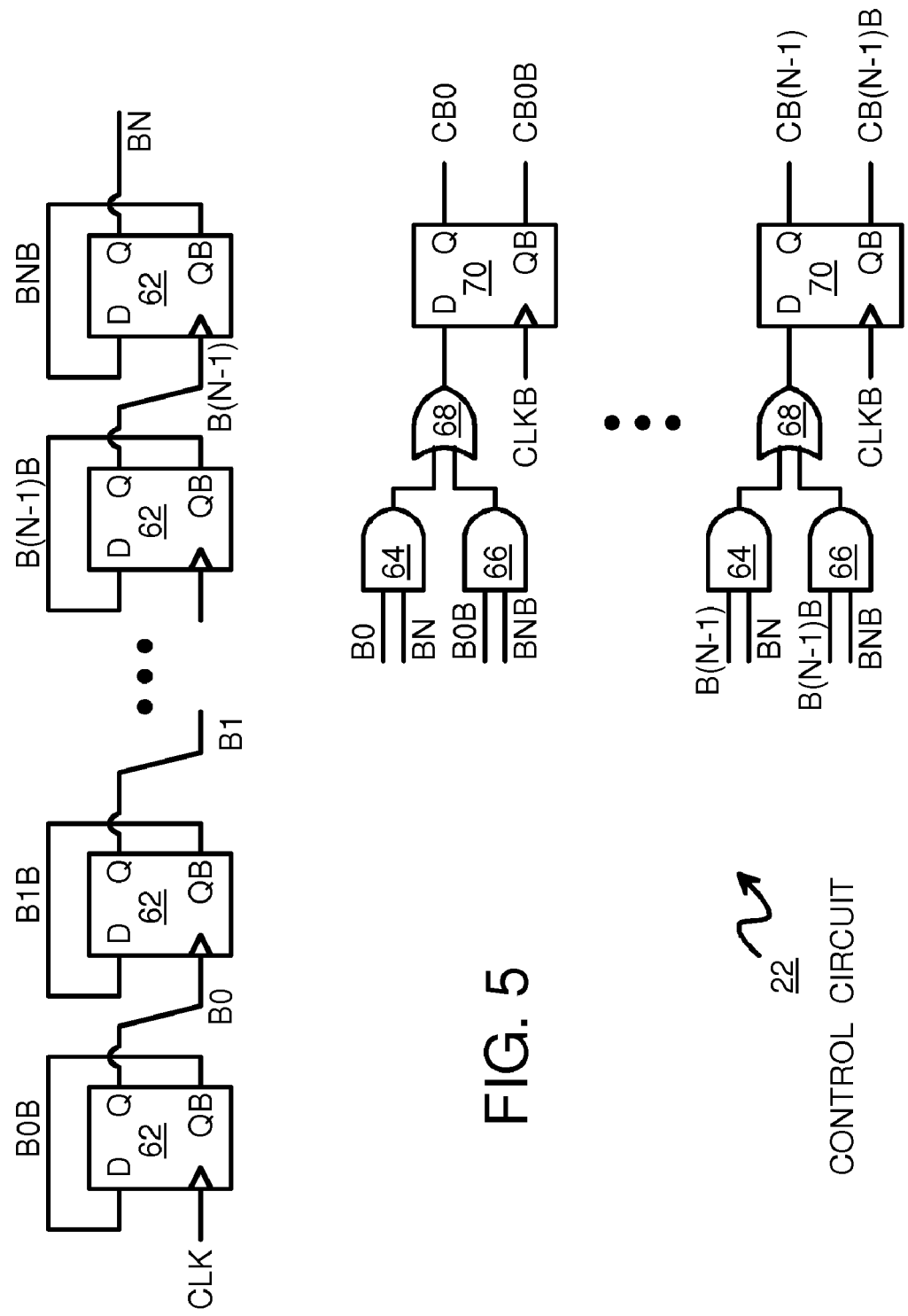
FIG. 5 is a diagram of the control circuit.

FIG. 5 is a diagram of the control circuit. Control circuit 22 of FIG. 4 is a binary up/down counter in some embodiments. An (N+1)-bit binary count value CB0:CBN is generated from input clock CLK, CLKB. The inverse count value is CB0B:CBNB. This count value CB0:CBN is input to DAC 20.

An intermediate count value B0:BN and its inverse bits B0B:BNB are generated by flip-flops 62. CLK is applied to the first of flip-flops 62, and each flip-flop 62 acts as a toggle flip-flop with its QB output fed back to its D input. The Q output of one flip-flop 62 is input as the clock to the next flip-flop 62. Flip-flops 62 act as a ripple counter producing a binary count value.

A final count value is generated from the intermediate count value by logic including AND gates 64, 66, OR gates 68, and flip-flops 70. AND gates 64 and 66 act as gate logic to pass either signal B0:B(N−1) or B0B:B(N−1)B to the D input of D-flip-flops 70 depending the logic signal of BN and BNB. When CLKB is rising from 0 to 1, flip-flop 70 clocks the input signal at D to its output Q and QB. The result is that the count value counts up in binary to FF, then counts down from FF to 00.

Figure 6:
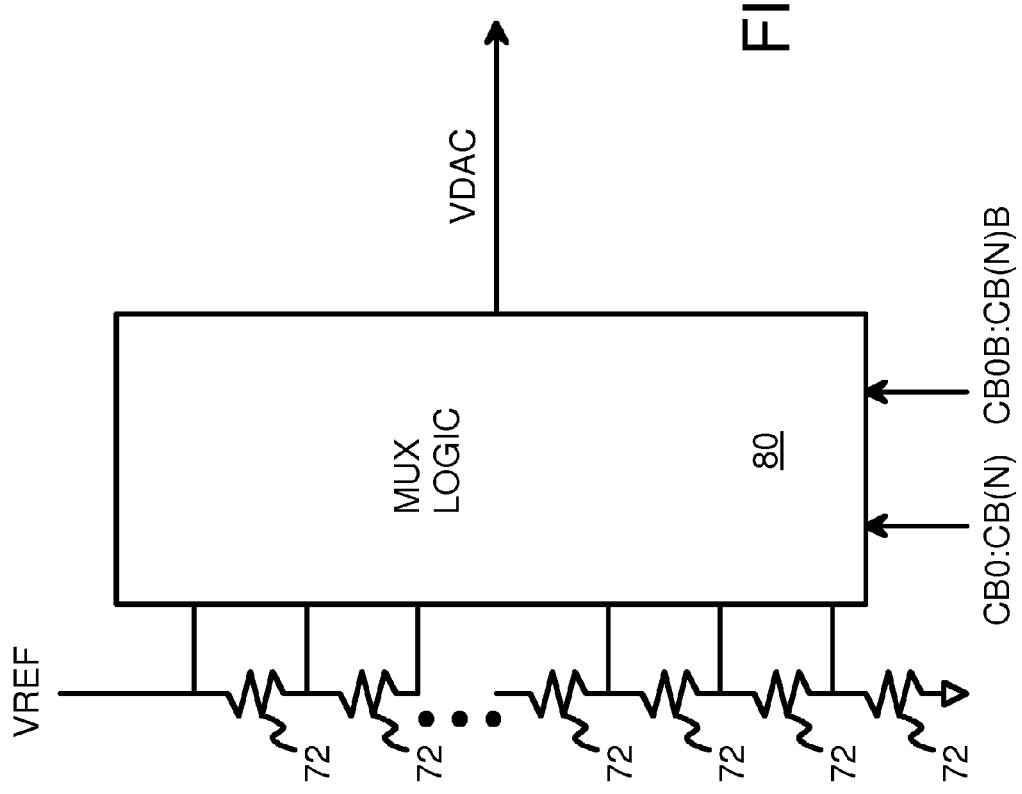
FIG. 6 shows a simple DAC.

FIG. 6 shows a simple DAC. Analog input voltage Vref is applied to a voltage divider of resistors 72 to ground, producing a series of voltages between Vref and ground. When resistors 72 all have about the same value, a series of intermediate voltages are produced. Mux logic 80 selects one of these intermediate voltages for output as VDAC. The select for mux logic 80 is the binary count value CB0:CBN and its inverse CB0B:CBNB from control logic 22.

DAC 20 can be a simplified DAC since subtractor 31 reduces the value of the voltage steps, so that errors produce a smaller effect on the frequency of CLK. Thus frequency dithering is more tolerant of errors. Resistors 72 do not have to be precisely matched, since some error is tolerable. Smaller currents may be used, reducing power. For example, resistors 72 may be matched in resistance values to within 5% of each other when errors are tolerated.

Figure 7:
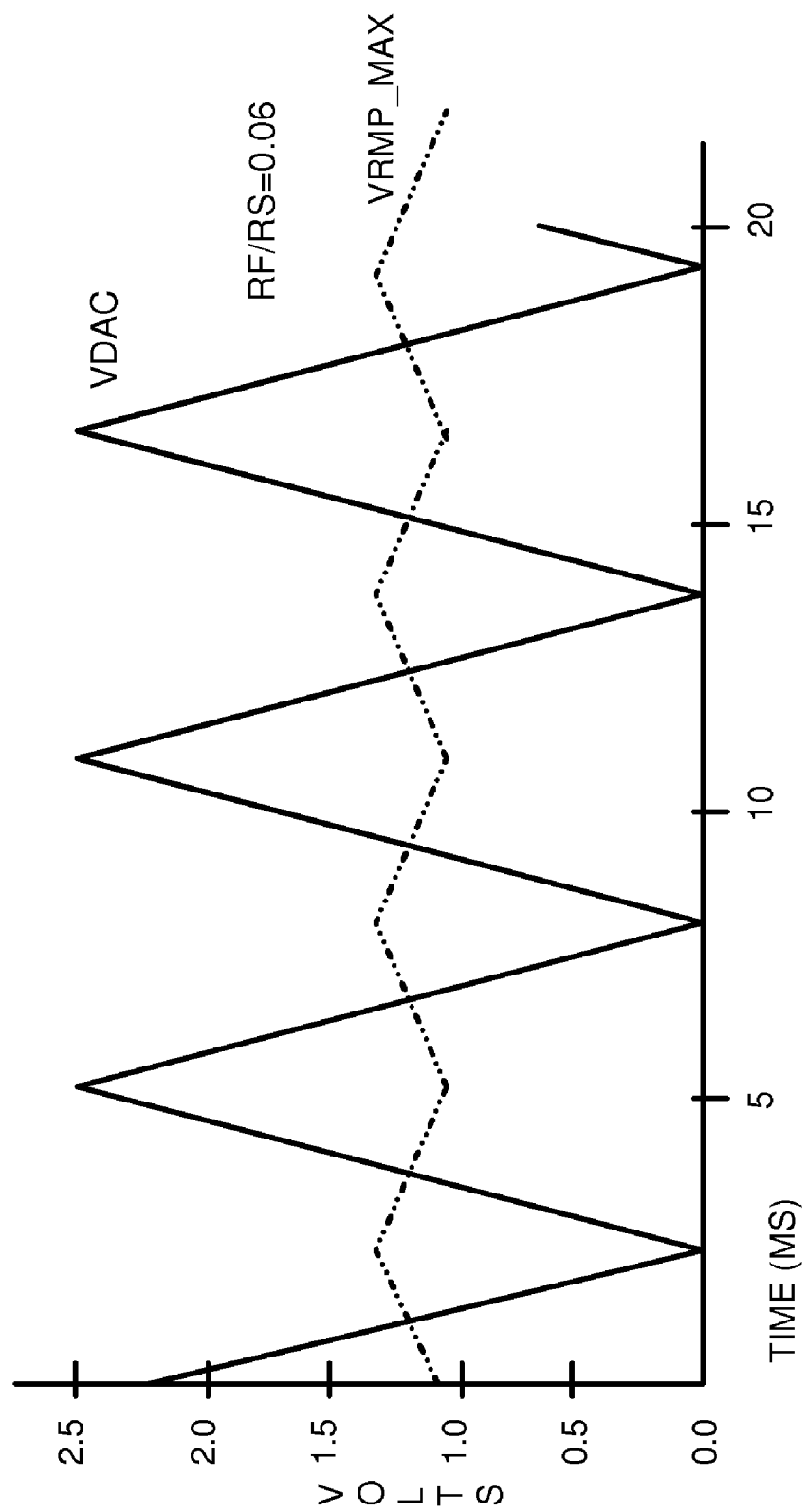
FIG. 7 is a waveform graph of sawtooth voltages for controlling frequency dithering.

FIG. 7 is a waveform graph of sawtooth voltages for controlling frequency dithering. VDAC is a sawtooth wave that slowly swings between ground and 2.5 volts. Subtractor 31 scales this down to a swing of only about 300 mV, from 1.1 to 1.4 volts on Vrmp_max.

Figure 8:
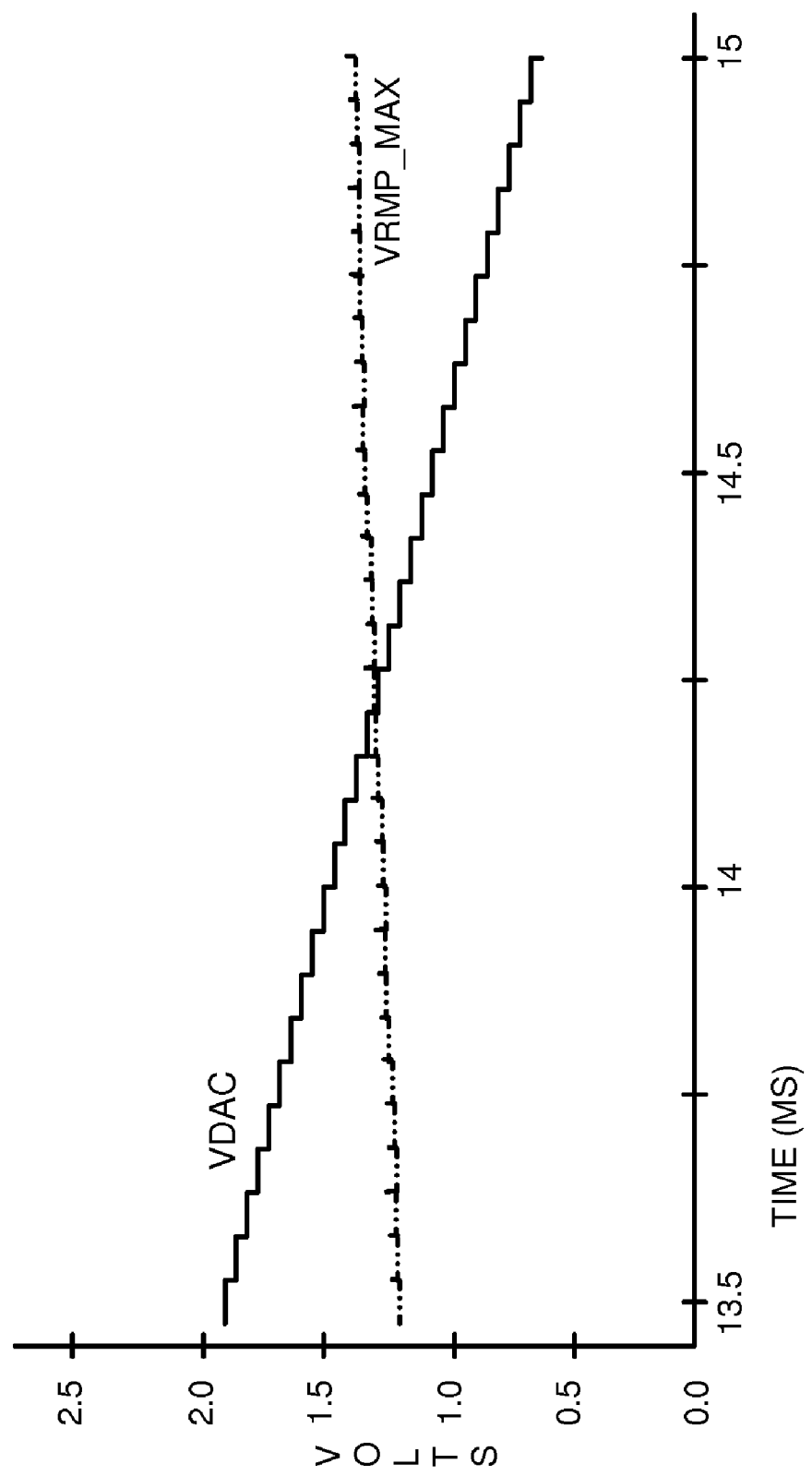
FIG. 8 is an expansion of the time scale of the waveform of FIG. 7.

FIG. 8 is an expansion of the time scale of the waveform of FIG. 7. VDAC slowly steps down each time clock CLK pulses, as the count value from control circuit 22 is reduced. Vrmp_max slows steps upward, but by smaller increments due to the attenuation by subtractor 31. The reverse behavior occurs for the other half of the sawtooth wave, when VDAC is stepping upward. and Vrmp_max is stepping downward.

Figure 9:
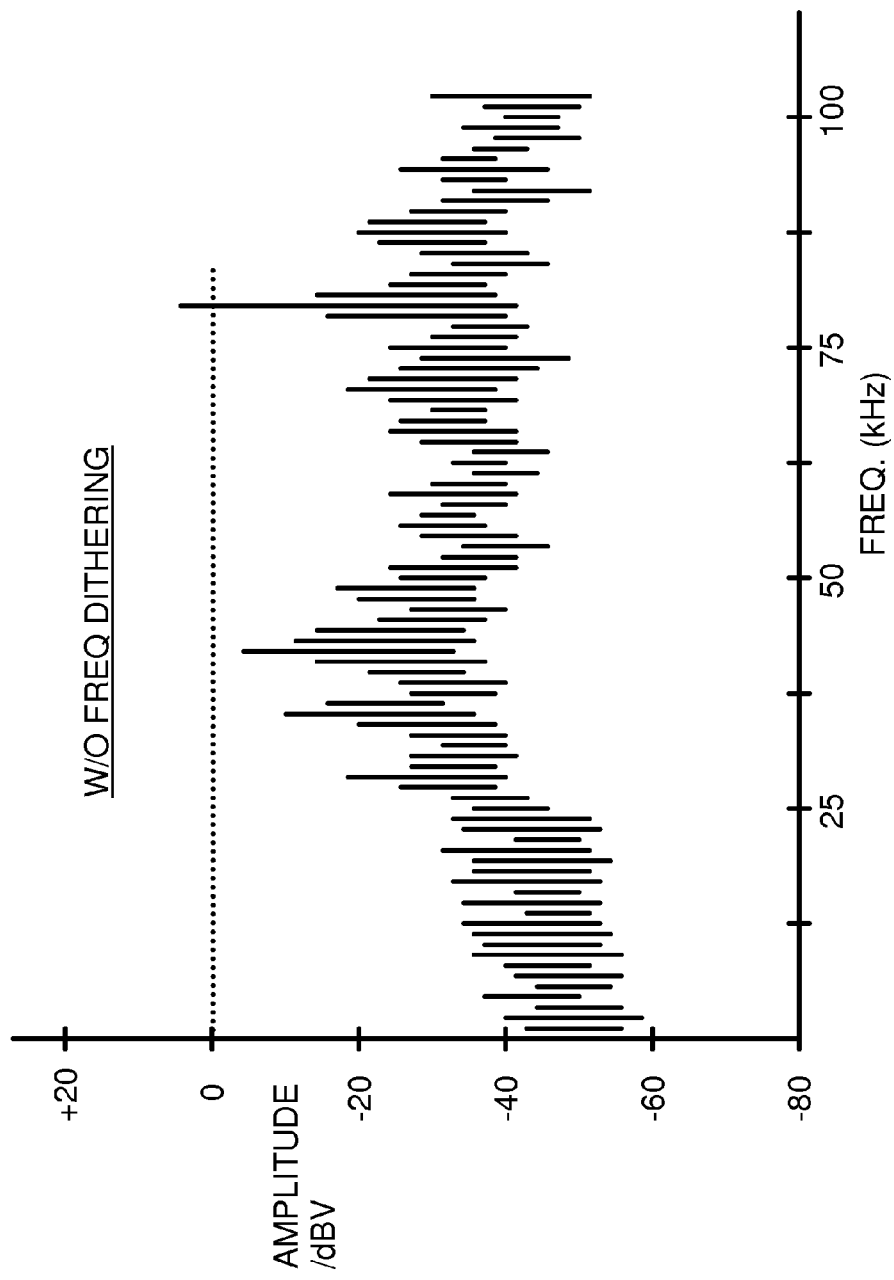
FIG. 9 is a spectrum diagram of an oscillator without frequency dithering.

FIG. 9 is a spectrum diagram of an oscillator without frequency dithering. In this idealized example, noise and emissions vary with frequency. The maximum emission occurs at about 80 kHz. The maximum emission is greater than 0 dBV. This may exceed emission limits.

Figure 10:
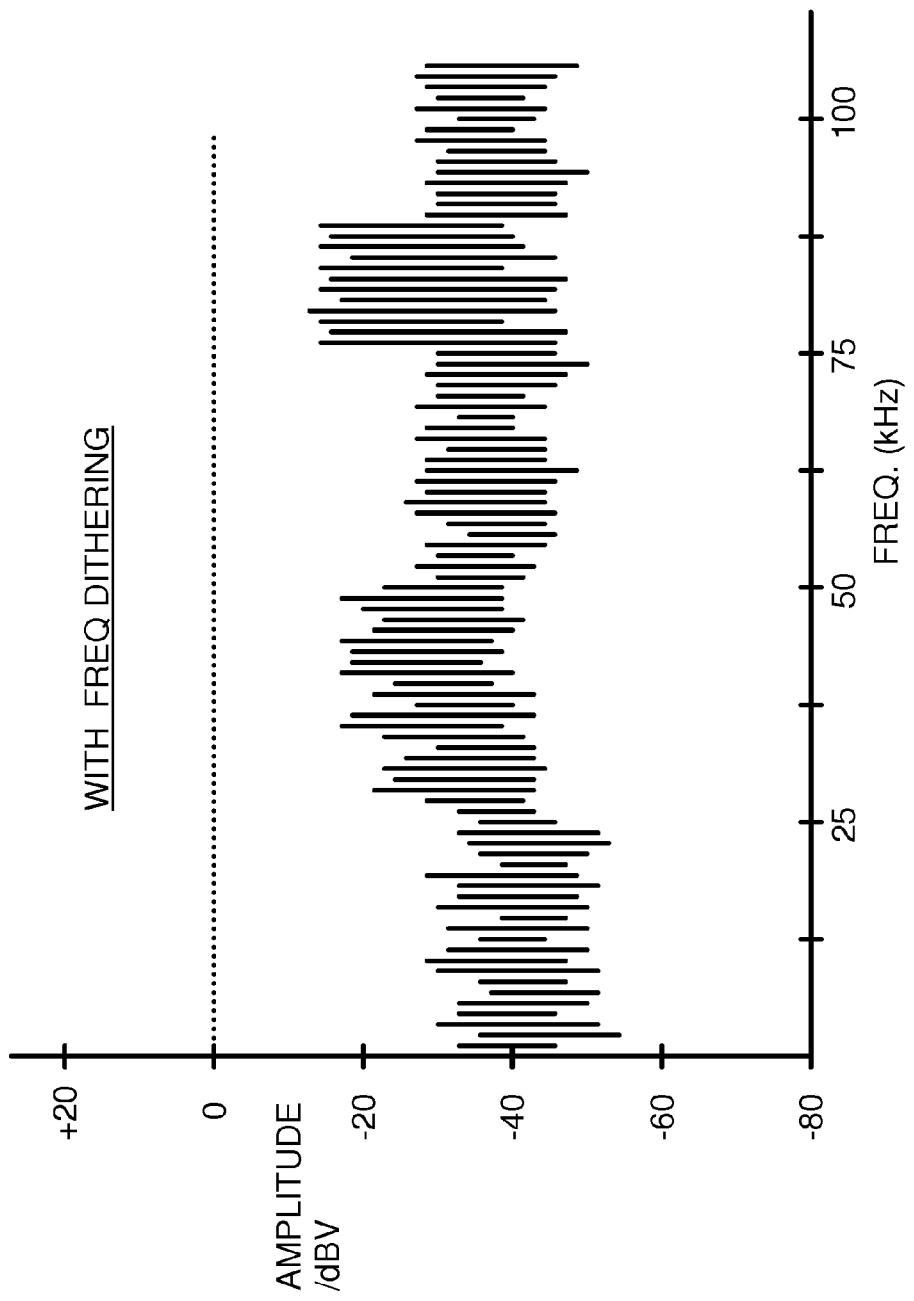
FIG. 10 is a spectrum diagram of a clock with frequency dithering, such as the circuit of FIG. 4.

FIG. 10 is a spectrum diagram of a clock with frequency dithering, such as the circuit of FIG. 4. In this example, noise and emissions vary with frequency. The maximum emissions occurs in a broad range of about 75-90 kHz. The maximum emission is about 15 dBV less than 0 dBV. This may meet emission limits. Thus frequency dithering spread out the peak emission over a wider range of frequencies, producing a broader and lower peak.

Figure 11:
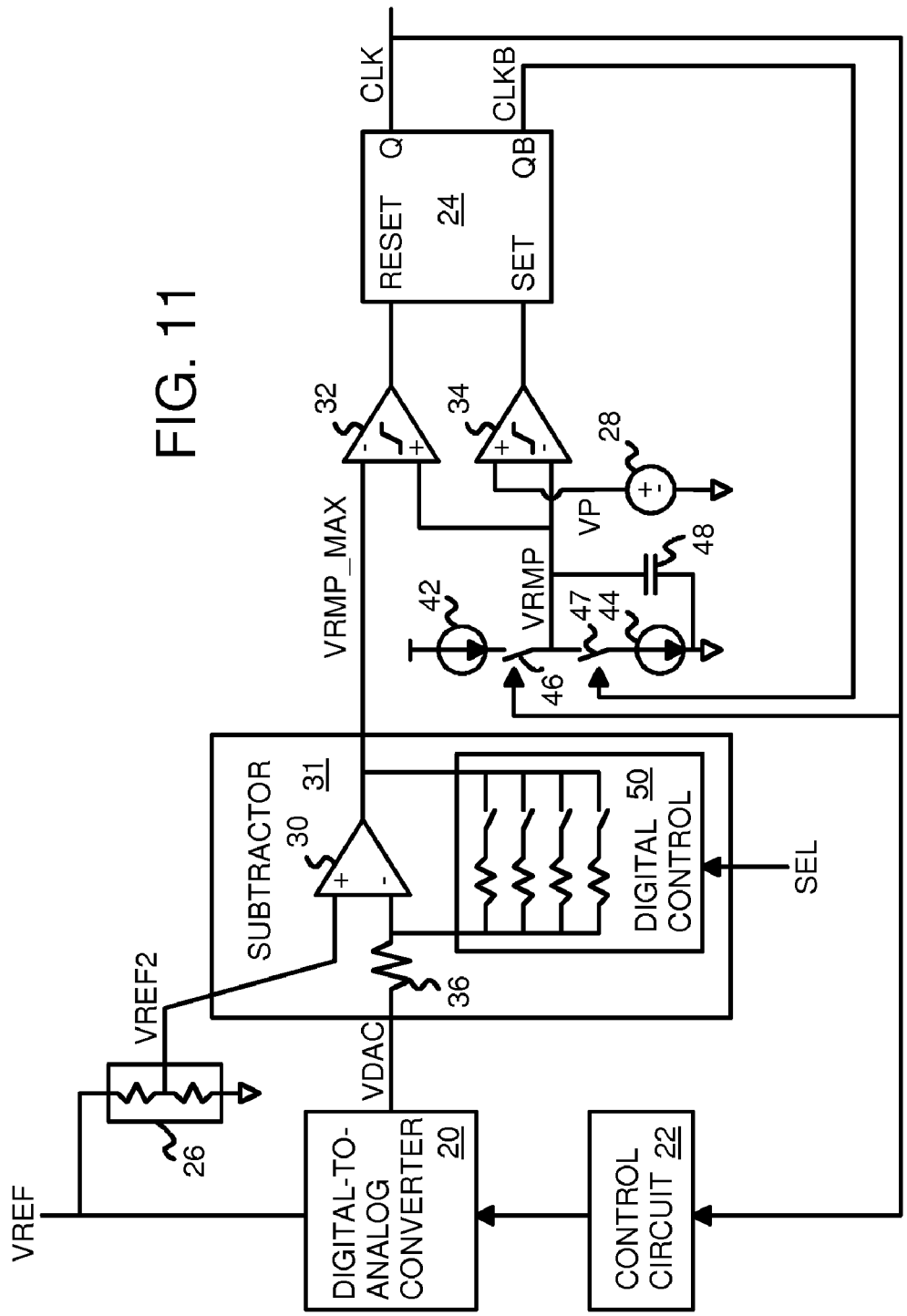
FIG. 11 is a programmable dithering circuit.

FIG. 11 is a programmable dithering circuit. The circuit is similar to that of FIG. 4, except that feedback resistor 18 is replaced by digitally-controlled resistor 50. The value Rf of the feedback resistance is controlled by digital select value SEL, which selects one or more parallel resistors using switches. Thus the value of Rf may be programmed.

FIGS. 12A-C are waveforms showing the effects on emissions of different programmable values of feedback resistance. Using digitally-controlled resistor 50 (FIG. 11), the ratio of feedback resistor 18 to input resistor 36, Rf/Rs, can be adjusted. This varies the contribution of feedback. The amount of frequency dithering is also varied as Vrmp_max swings over a wider voltage range for higher values of Rf/Rs.

In FIG. 12A, Rf/Rs is 0.03. A narrow peak emission of about −15 dBV occurs around 77 kHz. In FIG. 12B, Rf/Rs is 0.06. The peak emission is lowered to about −20 dBV but is spread over a wider range of frequencies.

In FIG. 12C, Rf/Rs is 0.09. The peak emission is lowered to less than −20 dBV but over a wider range of frequency.

Alternate Embodiments

Several other embodiments are contemplated by the inventors. For example, while the use of the dithering circuit for a power supply has been described, the dithering circuit may also be used in other power converters, or in more general applications such as a clock generator module or other clock generators. The charge pumps may be implemented as transistors as approximations.

A square wave, a sine wave, or other kinds of waveforms for modulation can be generated instead of the sawtooth wave described. The entire circuit may be integrated onto a single integrated circuit. Polarities of signals can be reversed. Other counting and encoding schemes other than binary may be used. The control logic can be implemented as a binary counter using synchronous rather than ripple logic, and can be implemented in a variety of ways. The DAC can be implemented in a variety of ways. Voltages and other data shown in the waveforms are examples and can vary with different embodiments and conditions. Reset inputs (not shown) can be added to each flip-flop 62, 70 in FIG. 5. Other kinds of bistables may be substituted for the SR latch, such as JK flip-flops, toggle flip-flops, D-type flip-flops, etc.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A dithering clock generator comprising:
   an oscillator that generates a clock having a frequency that varies with dithering to reduce Electro-Magnetic Interference (EMI);
   a control circuit, receiving the clock, for generating a digital count value that varies over time in response to the clock;
   a digital-to-analog converter (DAC) receiving the digital count value from the control circuit, the DAC generating a DAC voltage having a first voltage swing;
   a subtractor, receiving the DAC voltage, for scaling down the first voltage swing of the DAC voltage to generate a limit voltage having a second voltage swing, the second voltage swing being less than the first voltage swing; and
   a first comparator, receiving the limit voltage from the subtractor, for dithering the oscillator by adjusting timing of edges of the clock,
   whereby the first voltage swing of the DAC is reduced by the subtractor before dithering the oscillator.

2. The dithering clock generator of claim 1 wherein the subtractor comprises:
   an op amp receiving a subtractor reference voltage and receiving a combined voltage, for generating the limit voltage;
   a series resistor, receiving the DAC voltage and generating the combined voltage; and
   a feedback resistor, coupled to feed back the limit voltage to the combined voltage.

3. The dithering clock generator of claim 2 wherein the subtractor reference voltage is applied to a non-inverting input of the op amp;
   wherein the combined voltage is applied to an inverting input of the op amp.

4. The dithering clock generator of claim 2 wherein the feedback resistor has a feedback resistance value that is programmable;
   wherein a degree of dithering is adjustable by adjusting the feedback resistance value,
   whereby the degree of dithering is programmable.

5. The dithering clock generator of claim 4 wherein the feedback resistor comprises:
   a plurality of legs coupled between the limit voltage and the combined voltage, each leg having a resistor and a switch in series, wherein the switch is controlled by a programmed value, the programmed value determining the degree of dithering.

6. The dithering clock generator of claim 2 further comprising:
   a reference voltage applied to the DAC, wherein the DAC voltage is a fraction of the reference voltage, the fraction determined by the digital count value; and
   a voltage divider, receiving the reference voltage, for generating the subtractor reference voltage.

7. The dithering clock generator of claim 6 wherein the DAC comprises:
   a plurality of resistors in series between the reference voltage and a ground, producing a plurality of intermediate tap voltages; and
   muxing logic for selecting as the DAC voltage one of the plurality of intermediate tap voltages for output in response to the digital count value.

8. The dithering clock generator of claim 7 wherein the plurality of resistors are matched in resistance values to no more than 5%,
   wherein precision matched resistors are unnecessary.

9. The dithering clock generator of claim 7 wherein the plurality of resistors are matched in resistance values to no more than 10%,
   wherein precision matched resistors are unnecessary.

10. The dithering clock generator of claim 2 wherein the oscillator comprises:
    a capacitor for storing charge and generating a ramp voltage;
    a charge pump, activated by the clock being in a first state, for charging the capacitor;
    a discharge pump, activated by the clock being in a second state, for discharging the capacitor;
    a second comparator for comparing the ramp voltage to a lower limit voltage and generating a second trigger signal;
    wherein the first comparator compares the limit voltage from the subtractor to the ramp voltage and generates a first trigger signal;
    a bistable that toggles the clock in response to the first trigger signal and in response to the second trigger signal;
    whereby a period of the clock is adjusted by charging and discharging time of the capacitor that varies with variations in the limit voltage from the subtractor,
    whereby the clock is frequency dithered.

11. The dithering clock generator of claim 10 wherein the bistable is a set-reset latch, and the first trigger signal is applied to a reset input of the bistable, and the second trigger signal is applied to a set input to the bistable.

12. The dithering clock generator of claim 11 wherein the lower limit voltage is a fixed voltage and the limit voltage varies over time.

13. The dithering clock generator of claim 12 wherein the control circuit comprises a binary up-down counter.

14. The dithering clock generator of claim 12 wherein the control circuit further comprises a ripple binary counter that generates an intermediate count value, and combining logic and flip-flops that receive the intermediate count value to generate the digital count value.

15. A reduced-Electro-Magnetic Interference (EMI) clock generator comprising:
    a bistable that toggles to generate a clock;

a control circuit that changes a digital value in response to the clock;

a digital-to-analog converter (DAC) that converts the digital value from the control circuit into a DAC voltage on a DAC output;

a subtractor, receiving the DAC output and generating a reduced output by subtracting a feedback from the DAC voltage to generate a reduced DAC voltage on the reduced output;

a capacitor for storing charge on a ramp node to generate a ramp voltage;

a charge pump for charging the capacitor in response to the clock;

a charge sink for discharging the capacitor in response to an inverse of the clock;

a first comparator that compares the reduced DAC voltage to the ramp voltage to generate a first trigger input to the bistable; and a second comparator that compares a fixed voltage to the ramp voltage to generate a second trigger input to the bistable;

wherein the first trigger input and the second trigger input toggle the bistable.

16. The reduced-Electro-Magnetic Interference (EMI) clock generator of claim 15 wherein the subtractor comprises:

an op amp with a non-inverting input receiving a subtractor reference voltage and an inverting input coupled to a combining node;

a series resistor coupled between the DAC output and the combining node;

a feedback resistor coupled between the combining node and the reduced output.

17. The reduced-Electro-Magnetic Interference (EMI) clock generator of claim 16 wherein the feedback resistor is a variable resistor with a feedback resistance value that is determined by a select value;

wherein the feedback resistance value determines a degree of dithering of a frequency of the clock.

18. A dithering clock circuit comprising:

bistable means for generating a clock having a frequency that is dithered;

control circuit means, receiving the clock, for generating a digital count value that varies over time in response to the clock;

digital-to-analog converter (DAC) means for converting the digital count value from the control circuit means to generating a DAC voltage having a first voltage swing;

subtractor means, receiving the DAC voltage, for scaling down the first voltage swing of the DAC voltage to generate a limit voltage having a second voltage swing, the second voltage swing being less than the first voltage swing;

capacitor means for storing charge and generating a ramp voltage;

charge pump means, activated by the clock being in a first state, for charging the capacitor means;

discharge pump means, activated by the clock being in a second state, for discharging the capacitor means;

first compare means for comparing the ramp voltage to the limit voltage from the subtractor means to generate a first trigger signal;

second compare means for comparing the ramp voltage to a lower limit voltage and generating a second trigger signal;

wherein the bistable means toggles the clock in response to the first trigger signal and in response to the second trigger signal;

whereby a period of the clock is adjusted by charging and discharging time of the capacitor means that varies with variations in the limit voltage from the subtractor means, whereby the first voltage swing of the DAC means is reduced by the subtractor means before dithering the bistable means.

19. The dithering clock circuit of claim 18 wherein the subtractor means comprises:

op amp means, receiving a subtractor reference voltage and receiving a combined voltage, for generating the limit voltage;

series resistor means, receiving the DAC voltage, for generating the combined voltage; and feedback resistor means for conducting a feedback current from the limit voltage to the combined voltage.

20. The dithering clock circuit of claim 19 wherein the feedback resistor means further comprises a feedback resistance value that is programmable;

wherein a degree of dithering is adjustable by adjusting the feedback resistance value, whereby the degree of dithering is programmable.

\* \* \* \* \*